(12) United States Patent
Bergmann et al.

(10) Patent No.: US 8,101,900 B2
(45) Date of Patent: Jan. 24, 2012

(54) CIRCUIT AND METHOD FOR OPERATING A CIRCUIT

(75) Inventors: Guenther Bergmann, Blaustein (DE); Herbert Knotz, Erbach (DE); Peter Kolb, Illertissen (DE); Armin Prohaska, Ulm-Ermingen (DE); Holger Vogelmann, Schwendi (DE)

(73) Assignee: Atmel Corporation, San Jose, CA (US)

( * ) Notice: Subject to any disclaimer, the term of this patent is extended or adjusted under 35 U.S.C. 154(b) by 278 days.

(21) Appl. No.: 12/580,672

(22) Filed: Oct. 16, 2009

(65) Prior Publication Data

US 2010/0102208 A1 Apr. 29, 2010

(30) Foreign Application Priority Data

Oct. 29, 2008 (DE) .......................... 10 2008 053 707

(51) Int. Cl.
*H01J 40/14* (2006.01)

(52) U.S. Cl. ....... 250/214 R; 250/214 LS; 250/214 SW; 327/514

(58) Field of Classification Search .............. 250/214 R, 250/214 A, 214 LS, 214 SW, 551; 327/509, 327/514; 372/38.03
See application file for complete search history.

(56) References Cited

U.S. PATENT DOCUMENTS

| 4,368,385 | A | * | 1/1983 | Kanbe et al. | ................. 250/551 |
| 4,713,819 | A | * | 12/1987 | Yoshikawa | ....................... 372/9 |
| 2006/0038113 | A1 | | 2/2006 | Riedel et al. | |
| 2006/0261253 | A1 | | 11/2006 | Arao et al. | |

* cited by examiner

*Primary Examiner* — Kevin Pyo
(74) *Attorney, Agent, or Firm* — Baker Botts L.L.P.

(57) ABSTRACT

A circuit and method for operating a circuit with a terminal for connecting a photodiode to output an output current dependent on the photocurrent of the photodiode, with a resistance device for generating a voltage drop dependent on a photocurrent of the photodiode, with a control loop connected to the resistance device for generating the output current dependent on the photocurrent, with a switching means connected to the terminal with first switch positions for a first operating mode for operating the photodiode in the reversed bias and with second switch positions for a second operating mode for operating the photodiode in the photovoltaic mode, wherein in the first operating mode in the first switch positions of the switching means, the resistance device and the control loop are bridged and/or are not connected, and in the second operating mode in the second switch positions of the switching means, the terminal is connected to the resistance device.

5 Claims, 3 Drawing Sheets

CIRCUIT AND METHOD FOR OPERATING A CIRCUIT

This nonprovisional application claims priority under 35 U.S.C. §119(a) to German Patent Application No. DE 10 2008 053 707.1, which was filed in Germany on Oct. 29, 2008, and which is herein incorporated by reference.

BACKGROUND OF THE INVENTION

Field of the Invention

The present invention relates to a circuit and a method for operating a circuit with a terminal for connecting a photodiode to output an output current dependent on the photocurrent of the photodiode.

SUMMARY OF THE INVENTION

It is an object of the present invention to improve as much as possible a circuit with a terminal for connecting a photodiode. Accordingly, a circuit with a terminal for connecting a photodiode is provided. The circuit can be monolithically integrated on a semiconductor chip. The terminal can be a terminal of the semiconductor chip and can be formed as a pad structure. The circuit can be formed to output an output current dependent on the photocurrent of the photodiode.

The circuit can have a resistance device for generating a voltage drop dependent on a photocurrent of the photodiode. The circuit can have an analog control loop connected to the resistance device. The voltage drop across the resistance device in this case can form a target value for the control loop. The control loop can be formed for generating the output current dependent on the photocurrent. The control loop can beformed in such a way that the output current regulated by the control is proportional to the photocurrent through the photodiode (and through the resistance device), so that the output current is substantially proportional to the photocurrent in the adjusted state.

The circuit can have a switch connected to the terminal. The switch can have a number of semiconductor switches, such as field-effect transistors or bipolar transistors. The switch can have first switch positions for a first operating mode for operating the photodiode in the reversed bias. The switch can have second switch positions for a second operating mode for operating the photodiode in the photovoltaic mode.

In the first operating mode in the first switch positions of the switch, the switch bridges the resistance device and the control loop. The photocurrent in the first operating mode can be switched to the output of the circuit by the switch, so that the output current corresponds to or is the same as the photocurrent.

In the second operating mode in the second switch positions of the switch, the terminal can be connected to the resistance device. The control loop in the second operating mode can be formed to output the output current.

The object of the invention furthermore is to provide as improved a method as possible for operation. Accordingly, a method for operating a circuit with a terminal for connecting a photodiode is provided.

In the method, a switch can be controlled in first switch positions for a first operating mode when the photodiode is operated in the reversed bias.

In the method, a switch is controlled in second switch positions for a second operating mode when the photodiode is operated in the photovoltaic mode.

In the method, the switch can be controlled in third switch positions for a third operating mode when the photodiode is operated in the reversed bias and when a current direction, dependent on the photocurrent, is reversed for outputting by a current mirror. In this case, a current mirror is understood to be any circuit that reverses (mirrors) the current direction.

The embodiments described hereinafter relate both to the circuit and to the operating method. In this case, methods features can be derived from the functions of the circuit. Functions of the circuit can be derived from the corresponding methods features.

According to an embodiment, the switch can have third switch positions for a third operating mode for operating the photodiode in the reversed bias. In the third operating mode in the third switch positions of the switch, the terminal can be connected to a current mirror for reversing the current direction. A direction of the output current in regard to the photocurrent through the photodiode is defined by the current mirror. If, for example, the photocurrent flows out of the circuit into the photodiode, the current direction for the output current of the circuit is reversed, so that the output current also flows out of the circuit at its output.

The resistance device and/or the control loop can have a switchable resistor bank with several resistors, switchable in parallel or in series, and semiconductor switches for switching. The resistance device can be formed to set a proportionality between the photocurrent and the output current.

According to an embodiment, the analog control loop can have a differential amplifier, a current mirror, and a resistor and optionally a transistor connected to the output of the differential amplifier. Advantageously, an output of the current mirror can be connected to the output of the circuit by means of the switch.

According to an embodiment, the circuit can have a number of control inputs and optionally a control logic. The control inputs and/or the control logic can be formed to control the first switch positions and/or the second switch positions and/or the third switch positions of the switch. The control inputs and/or the control logic can be formed alternatively or in combination to control a resistance value of the resistance device.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
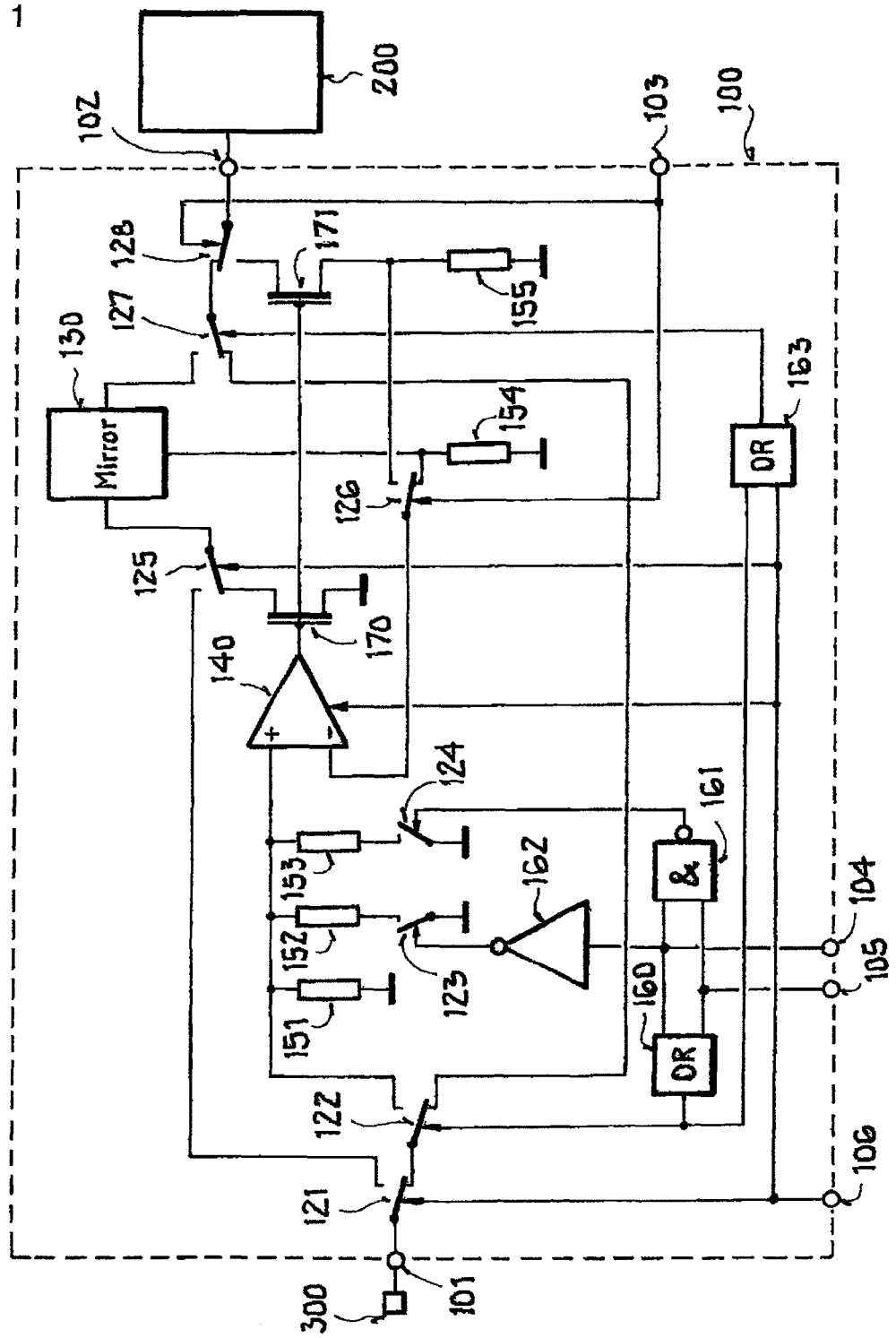
FIG. 1 is a circuit for connecting a photodiode.

A circuit for connecting a photodiode is shown schematically in FIG. 1. An interface circuit 100 and a transimpedance converter 200 are monolithically integrated into a semiconductor chip. An input 101 of interface circuit 100 is connected to a terminal 300 for connecting a photodiode (not shown in FIG. 1). Output 102 of interface circuit 100 is connected to an input of transimpedance converter 200. Transimpedance converter 200 converts the output current IA of interface circuit 100 into analog voltage to be evaluated.

Interface circuit 100 enables the operation of photodiodes connected to terminal 300 in three different operating modes. In a first operating mode, the photodiode is operated in the reversed bias and is connected to terminal 300 and to the cathode to a positive supply voltage (+5 V), so that the technical current direction of the photocurrent of the photodiode is directed into interface circuit 100. In a second operating mode, the photodiode is operated in the photovoltaic mode (photovoltaically) and is connected to terminal 300 and to ground, so that the technical current direction of the photocurrent of the photodiode is directed out of interface circuit 100. In a third operating mode, the photodiode is operated in the reversed bias and is connected to terminal 300 and to the anode to ground, so that the technical current direction of the photocurrent of the photodiode is directed out of interface circuit 100.

To be able to operate the photodiode at terminal 300 in the three operating modes, interface circuit 100 has a switch in the form of controllable semiconductor switches 121, 122, 123, 124, 125, 126, 127, 128. Semiconductor switches 121, 122, 123, 124, 125, 126, 127, 128 are controllable via control inputs 103, 104, 105, 106 and a logic with logic gates 160, 161, 162, 163. Interface circuit 100 has a current mirror 130 for reversing the current direction. Furthermore, interface circuit 100 has resistors 151, 152, 153, 154, 155, transistors 170, 171, and a differential amplifier 140.

Figure 2A:
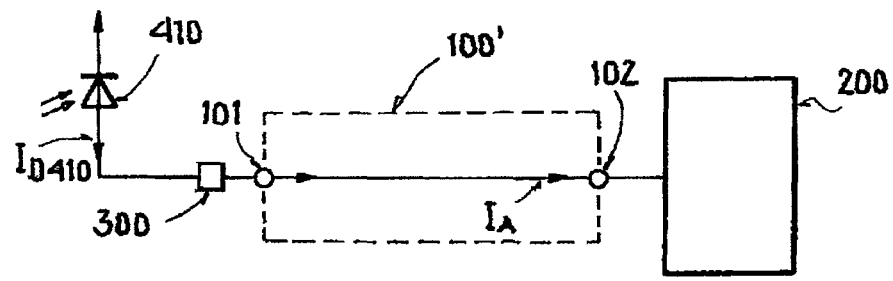
FIG. 2a is a first operating mode of the circuit according to FIG. 1.

The first operating mode is shown schematically in FIG. 2a. In this case, semiconductor switches 121, 122, 127, and 128 are switched in such a way that the photocurrent ID410 of photodiode 410, which is connected to a positive supply voltage (+5 V) and to terminal 300, flows in at input 101 of interface circuit 100' and at output 102 of interface circuit 100' flows unchanged as output current IA out of interface circuit 100' into transimpedance converter 200. The switch positions of semiconductor switches 121, 122, 127, and 128 for the first operating mode are also shown in FIG. 1. The entire interface circuit 100 is bridged by the switch positions of semiconductor switches 121, 122, 127, and 128.

Figure 2B:
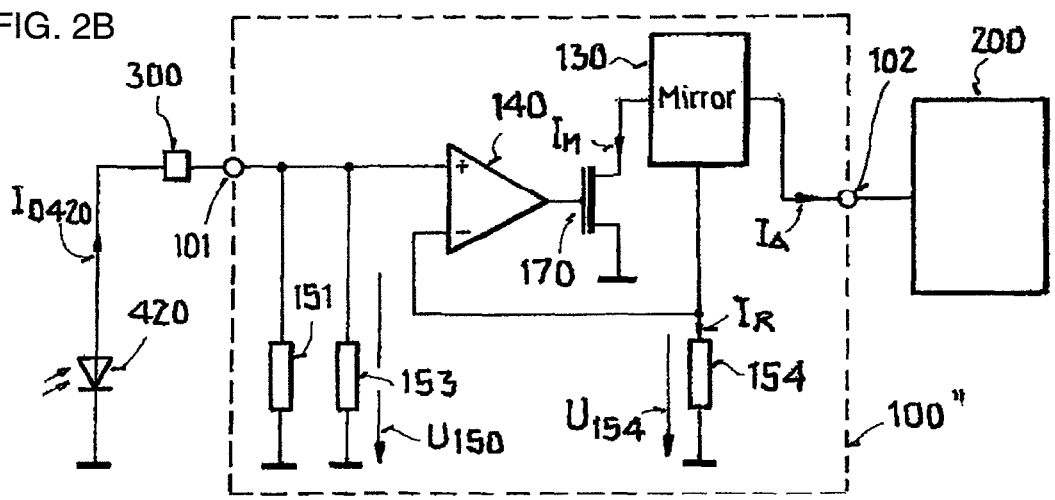
FIG. 2b is a second operating mode of the circuit according to FIG. 1.

The second operating mode is shown schematically in FIG. 2b. In this case, semiconductor switches 121, 122, 126, 127, 128 are switched in such a way that the photocurrent ID420 of photodiode 420, which is connected to the cathode to ground and to terminal 300, flows in at input 101 of interface circuit 100". The photocurrent ID420 flows divided across resistors 151 and 153 and at the parallel-connected resistors 151 and 153 generates the voltage drop U150, which corresponds to the diode voltage. Differential amplifier 140 has a high-impedance input connected to resistors 151 and 153, so that a current flow in the input of differential amplifier 140 can be disregarded.

Differential amplifier 140 together with (NMOS) transistor 170, current mirror 130, and resistor 154 forms a control loop, which has the effect that the current IR through resistor 154, the current IM through transistor 170, and the output current IA are substantially proportional to photocurrent ID420. In this case, a difference between the voltage U154 across resistor 154 and the voltage U150 across resistors 151 and 153 is amplified by differential amplifier 140. The non-inverted input of differential amplifier 140 can be or is connected to resistors 151, 152, 153.

The proportionality between output current IA, which flows over output 102 into transimpedance converter 200, and the photocurrent ID420 can be set by switching resistors 152 and 153 on or off by means of control inputs 104 and 105, NAND gate 161, and inverter 162. Alternatively, the proportionality can also be changed by a settable mirror ratio of current mirror 130 or by a settable resistor 154 (not shown in FIG. 1).

Figure 2C:
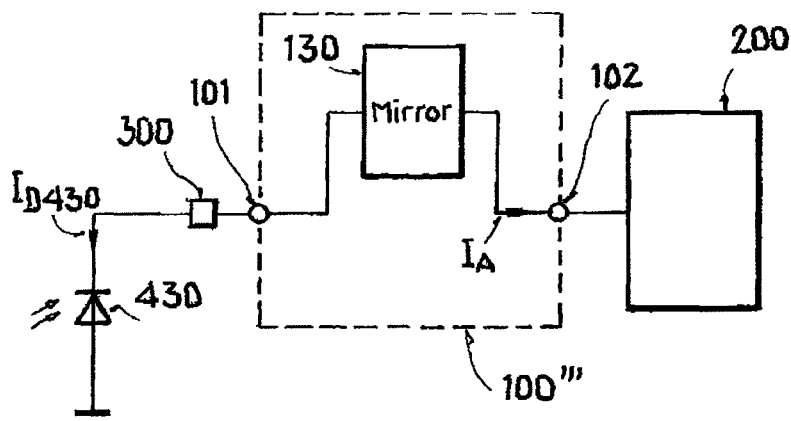
FIG. 2c is a third operating mode of the circuit according to FIG. 1.

The third operating mode is shown schematically in FIG. 2c. In this case, semiconductor switches 121, 125, 127, and 128 are switched in such a way that the photocurrent ID430 of photodiode 430, which is connected to the anode to ground and to terminal 300, flows out of input 101 of interface circuit 100'''. Current mirror 130 reverses the current direction, so that the output current IA at output 102 of interface circuit 100''' flows in the reverse direction out of interface circuit 100''' into transimpedance converter 200. If the mirror ratio of current mirror is 1:1, the output current IA is substantially the same as the photocurrent ID430 except for the sign.

Alternatively, it is also possible that the output current IA of interface circuit 100 flows into interface circuit 100. To this end, the subsequent transimpedance converter 200 can invert the output voltage. For example, it is possible in general to provide that the direction of the output current for all three operating types flows out of transimpedance converter 200 into interface circuit 100. According to the connection of photodiode 430 from FIG. 2c, for this purpose, current mirror 130 must be bridged in FIG. 2c (not shown). According to the connection of photodiode 410 of FIG. 2a, for the same current direction of the output current into the interface circuit in addition current mirror 130 is connected into the current path for reversing the current direction (not shown). In the photovoltaic mode, according to FIG. 2d, differential amplifier 140, transistor 171, and resistor 155 form a control loop, whereby the current through resistor 155 is regulated to a value substantially proportional to the current through resistors 151, 153. This current also flows through output 102 from transimpedance converter 200 into interface circuit 100"".

Figure 2D:
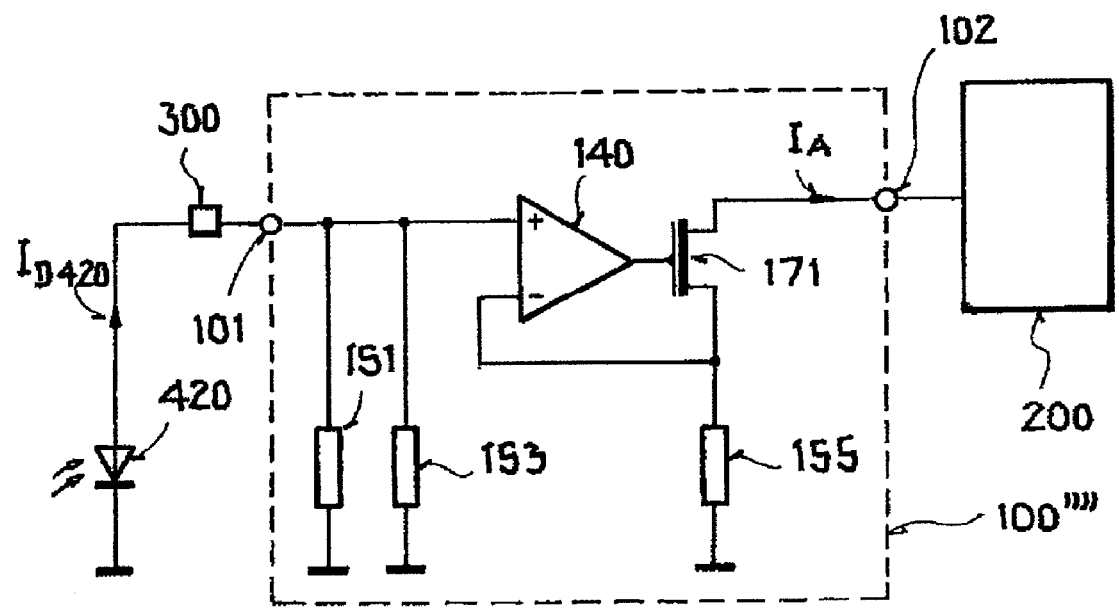
FIG. 2d illustrates a circuit according to a further embodiment.

The invention is not limited to the shown embodiment variants in FIGS. 1 through 2d. It is possible, for example, that the current mirror is formed to set the mirror ratio. The functionality of the circuit according to FIG. 1 can be used especially advantageously for an optical drive device for optical media (CD, DVD, BD—Blu-ray disc).

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit for outputting an output current based on a photo current of a photo diode, the circuit comprising:
    a terminal connectable to the photodiode;
    a resistance device configured to generate a voltage drop based on the photocurrent of the photodiode;
    a control loop connectable to the resistance device and configured to generate the output current based on the photocurrent; and a switching means connectable to the terminal having a first switch position for a first operating mode for operating the photodiode in reversed bias and having a second switch position for a second operating mode for operating the photodiode in a photovoltaic mode, wherein, in the first operating mode in the first switch position of the switch, the resistance device and the control loop are by-passed and/or are not connected, and wherein, in the second operating mode in the second switch position of the switch, the terminal is connected to the resistance device.

2. The circuit according to claim 1, wherein the switch has a third switch position for a third operating mode for operating the photodiode in the reversed bias, and wherein, in the third operating mode, the terminal is connected to a current mirror for reversing the current direction.

3. The circuit according to claim 1, wherein the resistance device and/or the control loop have a plurality of resistors that are switchable in parallel and/or in series and semiconductor switches for switching.

4. The circuit according to claim 1, further comprising a plurality of control inputs and a control logic configured to control the first switch position and/or the second switch position and/or a third switch positions of the switch and/or configured to control a resistance value of the resistance device.

5. A method for operating a circuit with a terminal for connecting a photodiode, the method comprising:
  controlling a switch such that the switch is in a first switch position for a first operating mode when the photodiode is operated in reversed bias;
  controlling the switch such that the switch is in a second switch position for a second operating mode when the photodiode is operated in a photovoltaic mode;
  controlling the switch such that the switch is in a third switch position for a third operating mode when the photodiode is operated in the reversed bias; and
  reverting a current direction of an output current compared to a current direction of a photo current of the photodiode at the terminal.

* * * * *